(12) United States Patent
Bukhin et al.

(10) Patent No.: US 9,471,718 B2
(45) Date of Patent: Oct. 18, 2016

(54) PERSONALIZATION OF RECOMMENDATIONS BASED ON BUILDING MODEL AND BEHAVIORAL SCIENCE

(71) Applicant: Tendril Networks, Inc., Boulder, CO (US)

(72) Inventors: Michael Bukhin, Otis, MA (US); Paul Cole, Gloucester, MA (US); Charles D. Corbin, Boulder, CO (US); Emily Weitkamp, Pittsburgh, PA (US)

(73) Assignee: Tendril Networks, Inc., Boulder, CO (US)

( * ) Notice: Subject to any disclaimer, the term of this patent is extended or adjusted under 35 U.S.C. 154(b) by 861 days.

(21) Appl. No.: 13/829,252

(22) Filed: Mar. 14, 2013

(65) Prior Publication Data

US 2014/0278264 A1    Sep. 18, 2014

(51) Int. Cl.
*G06F 17/50* (2006.01)

(52) U.S. Cl.
CPC ................ *G06F 17/5004* (2013.01)

(58) Field of Classification Search
CPC .................................................. G06F 17/5004
USPC .................................................. 703/1, 6, 18
See application file for complete search history.

(56) References Cited

U.S. PATENT DOCUMENTS

| 8,583,531 | B2* | 11/2013 | Hirl | G06Q 40/06 705/35 |
| 9,026,261 | B2* | 5/2015 | Bukhin | G06Q 10/06 700/276 |
| 2008/0306985 | A1 | 12/2008 | Murray et al. | |
| 2011/0029341 | A1* | 2/2011 | Muse | G06Q 10/063 705/7.11 |
| 2012/0053740 | A1 | 3/2012 | Venkatakrishnan et al. | |
| 2012/0173456 | A1 | 7/2012 | Hirl | |
| 2013/0325377 | A1* | 12/2013 | Drees | G01R 21/00 702/61 |

OTHER PUBLICATIONS

Econorthwest, "Process Evaluation of the SCE Aug. 2006 Home Energy Efficiency Survey (HEES) Program," Aug. 2009. <URL: http://www.calmac.org/publications/SCE_HEES_Final_Report_080409_calmac_edit.pdf> entire document, Aug. 4, 2009, 121 Pages.
PCT, "WIPO International Search Report and Written Opinion", Sep. 19, 2014, 12 Pages.

* cited by examiner

*Primary Examiner* — Kamini S Shah
*Assistant Examiner* — Juan Ochoa
(74) *Attorney, Agent, or Firm* — Perkins Coie LLP

(57) ABSTRACT

The technology disclosed herein provides accurate, targeted, building improvement content in a way that resonates with the user by considering the user's whole ecosystem. The technology uses details of the user's home, neighborhood, family, environmental and historical factors, goals, economic situation, and motivations and preferences to tailor content to a user's personal situation. A server or other computing device may accomplish this by receiving data from the client, a third party, or data local to the server; building modeling constructs based on these data sets such as a physics-based model of the building and a behavioral model of the user; operating these models relative to possible discrete building improvement content units; and using the results to determine personalized building improvement content for the user such as, for example, a webpage.

20 Claims, 5 Drawing Sheets

PERSONALIZATION OF RECOMMENDATIONS BASED ON BUILDING MODEL AND BEHAVIORAL SCIENCE

BACKGROUND

As energy resources become scarcer, and as people become more environmentally conscious, the demand for building improvement information has increased. The many attempts to meet this demand have been met with limited success. For example, numerous products and websites provide generic lists with building improvement recommendations and saving estimates. These lists are often misleading or avoided by users due to their tendency to over- or underestimate potential savings, because they contain impractical suggestions, and because they tend to include irrelevant information.

Even where websites provide building improvement information for a variety of situations, internet uses may be unwilling to sift through this content to find the information that applies to their situation. Furthermore, users may be put off by suggestions that do not correspond to their social motivations. In many cases, the users do not know enough specifics about their building, region, or energy consumption to discern which suggestions they should follow.

BRIEF DESCRIPTIONS OF THE DRAWINGS

DETAILED DESCRIPTION

Figure 1:
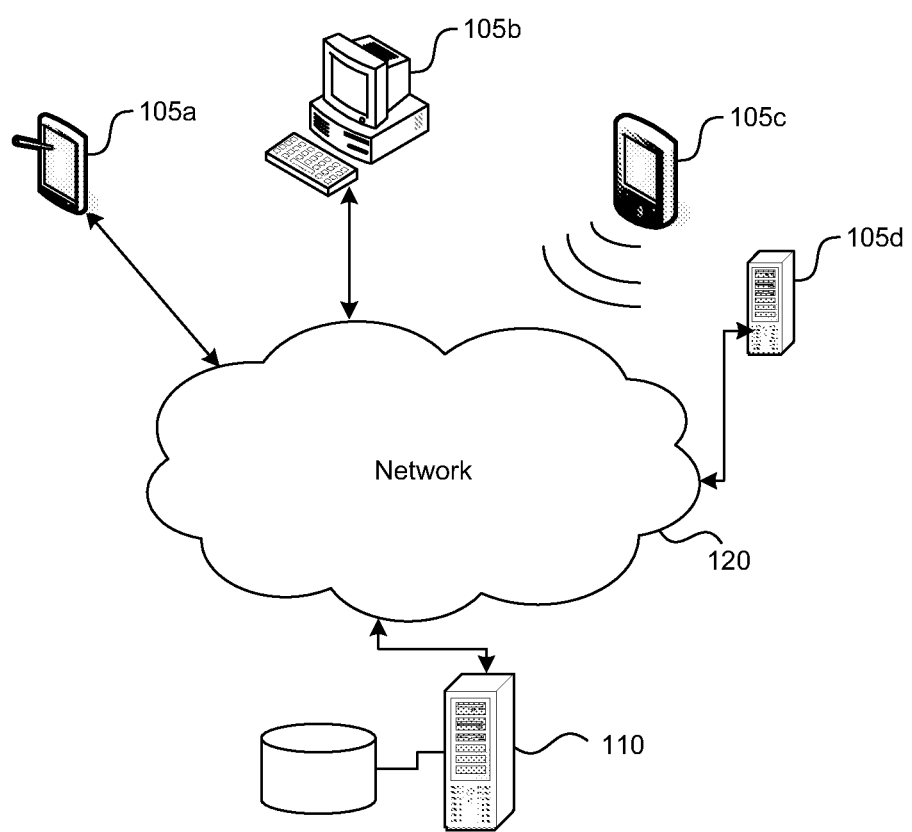
FIG. 1 is a block diagram illustrating an overview of an environment and devices on which some embodiments of the current application may operate.

Technology is disclosed for building personalized building information content ("the technology"). In some embodiments, this is accomplished by a server computing device ("server") which receives data from one or more of: a client computing devices ("client"); a third party system such as a utility service provider, social network, building audit service, weather service, public or private reporting service, etc. ("third party"); or data locally available to the server such as browsing history, stored regional or national default values, or generic default values. In various embodiments, the server or an associated device generates personalized building improvement content to transmit for display by the client.

Some factors controlling the desirability and impact of building improvement content on user behavior are the accuracy, relevance, and perceived trustworthiness of the content. The technology provides accurate, targeted building improvement content in a way that resonates with the user by considering the user's whole ecosystem. In various embodiments, details of the user's home, neighborhood, family, environmental and historical factors, goals, economic situation, and motivations and preferences are considered to tailor content to a user's personal situation. A server or other computing device may accomplish this by receiving user data and building data sets, building modeling constructs based on these data sets, and operating these models relative to possible discrete building improvement content units ("recommendations") to determine personalized building improvement content to present to the user as, for example, a webpage. As used herein, a user may be an operator of the system, members of the operator's household, employees that work in the operator's building, visitors to the operator's building, or others that interact with the operator's building.

In some embodiments, the server may receive data representing features of a building and data representing user characteristics. The server may use this data to create a user profile comprising one or more data structures such as a building profile and a behavioral model. The building profile may contain information about the physical properties of the building and a physics-based model of the building. The physics-based model of the building may be a set of functions or a set of data capable of being used by generic functions to predict operating conditions of the building. For example, the building profile may contain 1) entries for the building's location, square footage, type of heating, and amount of insulation, and 2) a set of functions that produce, for a building with this kind of heating and insulation, given a particular day of the year, the likely energy consumption due to heating on the given day. The behavioral model may contain information such as demographics, historical behavior measured through interactions with the system, historical consumption, committed and completed savings actions, and responses to questionnaires. With this information, the system finds correlations, for example a probabilistic model, between users to select a set of recommendations that are likely to benefit the user or that the user will follow.

In some embodiments, the server may execute a recommendation personalization engine ("RPE"), which has access to a user profile, to generate personalized building improvement content. The RPE may start by retrieving a set of filtered recommendations corresponding to data applicable to the user and building. This may be accomplished by applying a set of filters. In some embodiments the filters remove, from a set of recommendations available to the server, recommendations non-applicable to the user profile. In some embodiments, the filters may generate search parameters for a database to select recommendations relevant to the user profile. In some embodiments, the filters may reorganize recommendations from an initial recommendation set. In yet further embodiments, the filters may modify display properties for recommendations, such as hiding recommendations that do not correspond to the user profile, or an emphasis style to recommendations that are relevant to the user profile.

Once the server has a set of filtered recommendations, in some embodiments it may build one or more building scenarios. A building scenario creates a virtual representation of the result of implementing on the building one or more recommendations, by applying functions of the physics-based building model. In some embodiments an "ideal building" is created by creating a building scenario with all the applicable recommendations implemented.

In some implementations, the server may select recommendations or format output based on a behavioral model of the user's profile. The server may select or modify recommendations by operating the behavioral model to assign confidence levels to filtered recommendations that the recommendation will be helpful, followed, or found valuable to the user. These confidence levels may be used to add or remove recommendations from the set of recommendations that are displayed to the user, or they may be used to modify a display property of recommendations. For example, recommendations with a higher confidence level may be shown to the user first or with greater emphasis.

The server may then generate output elements to transmit to a client device for display. The output elements incorporate data from one or more of the probable recommendations, building scenarios, and set of filtered recommendations. The recommendations the system chooses to create output elements may be based in part on confidence levels assigned to various recommendations.

It is to be understood that the logic illustrated in each of the following block diagrams and flow diagrams may be altered in a variety of ways. For example, the order of the logic may be rearranged, sub-steps may be performed in parallel, illustrated logic may be omitted, other logic may be included, etc.

FIG. 1 is a block diagram illustrating an overview of an environment and devices on which some embodiments of the current technology may operate. A system for implementing the technology may include one or more client computing devices 105A-D and server computing devices 110. Components of each client 105A-D and server 110 may include, but are not limited to, one or more processing units, a system memory, a storage unit, a network interface or adapter, a display, and an input device. One or more client computing devices 105A-D may be referred to herein as client 105.

Client 105 and/or server 110 may include a variety of computer-readable storage media, e.g., a magnetic storage device, flash drive, RAM, ROM, tape drive, disk, CD, or DVD. Computer-readable media can be any available storage media and include both volatile and nonvolatile media and removable and non-removable media.

Client 105 and server 110 may operate in a networked environment using logical connections to one or more remote computing devices through network 120. Server 110 may be a dedicated server, a personal computer, mobile device, embedded device, or any other computing device or set of computing devices, such as a "cloud based" system of servers, capable of serving data to a client computing device. In some embodiments, a device may act as both a client and server computing device. Network 120 can be a local area network (LAN) or a wide area network (WAN), but may also be other wired or wireless networks. The client 105 and server 110 may be connected to network 120 through a network interface, such as a wired or wireless network.

Several embodiments disclosed herein describe an interaction between a server and a client. It will be understood that the client could perform many of the operations described as performed by the server. Alternatively, a server could perform many of the operations described as performed by the client. Furthermore, the embodiments described herein could be performed by an application on a single device, using local data or receiving data from a network, without requiring the use of a server.

The technology is operational with numerous other general purpose or special purpose computing system environments or configurations. Examples of well-known computing systems, environments, and/or configurations that may be suitable for use with the technology include, but are not limited to, personal computers, server computers, handheld or laptop devices, cellular telephones, tablet devices, multiprocessor systems, microprocessor-based systems, set-top boxes, programmable consumer electronics, network PCs, minicomputers, mainframe computers, distributed computing environments that include any of the above systems or devices, and the like.

Several embodiments of the technology are described in more detail in reference to the Figures. The computing devices on which the described technology may be implemented may include one or more central processing units, memory, input devices (e.g., keyboard and pointing devices), output devices (e.g., display devices), storage devices (e.g., disk drives), and network devices (e.g., network interfaces). The memory and storage devices are storage computer-readable media that may store instructions that implement at least portions of the described technology. In addition, the data structures and message structures may be stored or transmitted via a data transmission medium, such as a signal on a communications link. Various communications links may be used, such as the Internet, a local area network, a wide area network, or a point-to-point dial-up connection. Thus, computer-readable media can comprise computer-readable storage media and computer-readable transmission media.

Figure 2:
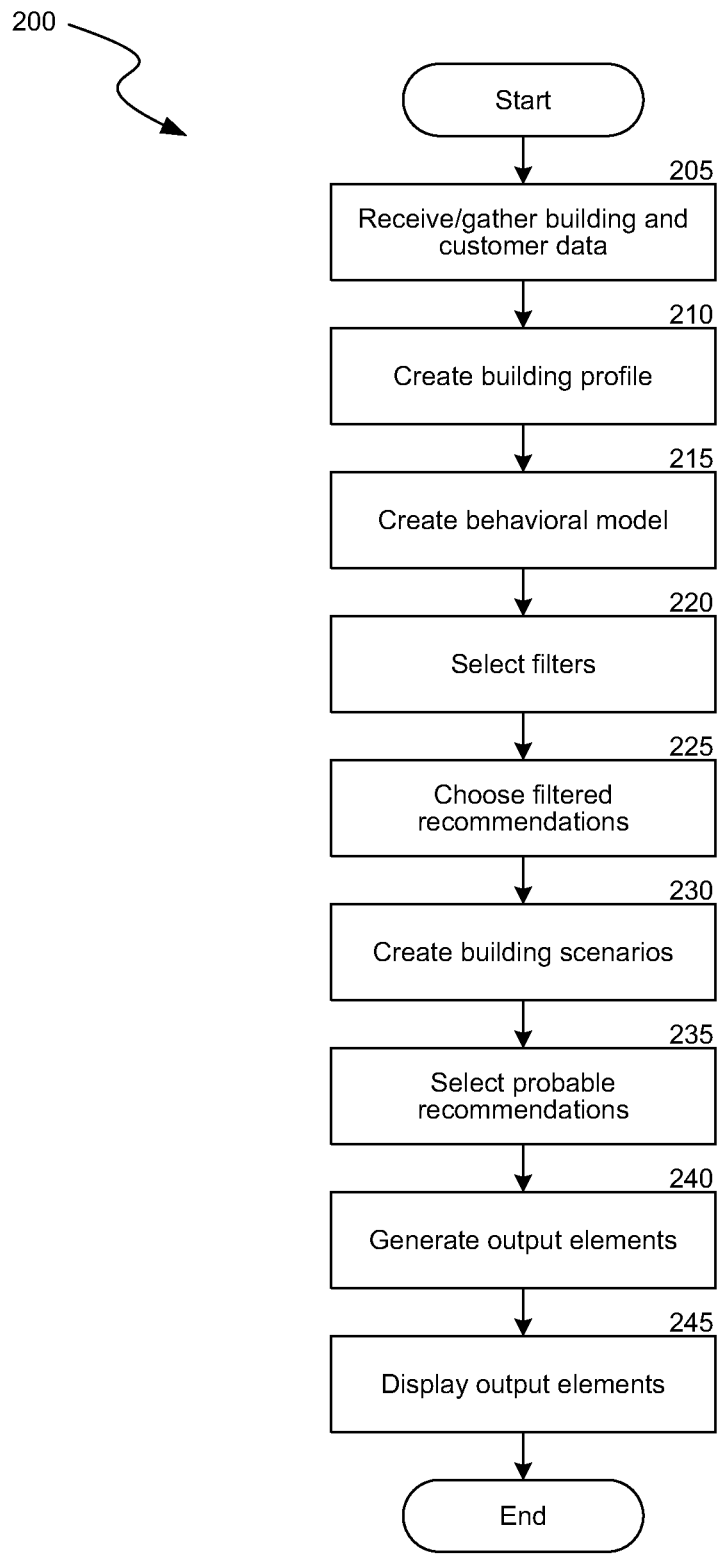
FIG. 2 is a flow diagram illustrating at least one embodiments of a routine to generate, based on a building model and behavioral science, personalized building improvement content.

FIG. 2 is a flow diagram 200 illustrating at least one embodiment of a routine to generate, based on a building model and behavioral model, personalized building improvement content. Beginning at block 205, the system receives data comprising building and customer data. As discussed in further detail in relation to FIGS. 4A and 5, this data may be received from a client, may be received or requested from a 3rd party, and/or may be locally available to the system. This data may pertain directly to the building and user, such as data points and historical data for the user's actual building and behavior. This data may also indirectly pertain to the user and their building through statistics, such as regional or national averages or other values selected based on known user properties. Furthermore, in some cases the data may contain universal defaults which the system may use when it does not have a correlation between a known user property and a desired user property. The system then continues to block 210 where it produces a building profile comprising building properties and a building model. The system produces the building properties by inferring and storing, in the received data, physical characteristics of a building. Examples of properties of the building include historical bills, real-time/disaggregated plug level data, real-time/HAN data, building structure information (size, levels, construction, age, etc), HVAC information (fuels, heating type, cooling type, etc), end use information (appliances, electronics, etc), user behavioral information (usage patterns, meter readings, etc), regional weather patterns, and gas, electric, and water loads. The system then creates a building model by generating functions that show how the building will respond under various conditions. In some embodiments the building model consists of a set of parameters for generic functions. The building model may be physics-based in that the functions apply physics formulas to determine how a condition will affect the operation of the building. In some embodiments the building model is created on a time scale, such as hourly, daily, or monthly. A time scale building model can determine how a condition will affect the operation of a building during a time range of interest.

As an example, one function of a building model on an hourly time scale may be to determine the amount and cost of energy consumption using different types of heaters. This building model could account for: variable energy pricing and temperature conditions throughout a day at a given time of year, the user's desired home temperature, the heat retaining properties of the building; and efficiency values for the home's current heating system. For example, this building model would be able to calculate that the user's house, on a typical January 5th, from 8 am to 6 pm (which is partly off-peak and partly peak consumption hours for this user's energy provider), using the home's current heating system, costs $12 to heat, but with an upgraded, more efficient furnace, this cost could be reduced to $9.

Once the building profile is created, the system moves on to block 215 where it creates a behavioral model. The behavioral model uses information such as demographics, historical behavior measured through interactions with the software, historical consumption, committed and completed savings actions, and responses to questionnaires. With this information, the system finds correlations (probabilistic models) between users to select a set of recommendations from a database that most likely applies to a given user and are most likely to benefit the user.

The system then selects filters at block 220. Filters operate by either limiting or emphasizing recommendations based on the user's profile. The purpose of filters is to provide recommendations the user will find relevant. Filters that limit may be selected to eliminate or minimize recommendations that do not correspond to the user's profile. For example, a filter to remove recommendations relating to upgrades for a gas furnace may be employed if the user's building profile indicates that the building already has a gas furnace. Filters may also be selected to add or emphasize recommendations or reorder them within a set. For example, if a user's building profile indicates the building has lead-based paint, a filter may be selected that helps build a database query for recommendations that include lead paint removal services. As another example, if a user's building profile indicates that the user's home has no insulation, a filter may be selected that adds a bold style to all recommendations relating to insulation. Filters may be selected based on a single user profile characteristic, as in the case of the lead-based paint example above, or may be based on a combination of user profile characteristics, such as a filter for homes that have gas heaters, that are in the Seattle area, and where the user is spending more than $100/month on their gas bill. This system allows product, service, or advertisement providers to submit recommendations along with one or more filters. These recommendations can be automatically incorporated into the system based on the filters provided.

Once filters are selected, the system moves on to block 225 where the filters are operated to choose filtered recommendations. In some embodiments the system receives an initial set of recommendations which may be all the recommendations available to the system, a predetermined regional set of recommendations, or a default starting recommendation set. In other embodiments, filters may generate query parameters for a database to select recommendations relevant to the user profile. The result is a filtered set of recommendations. In some embodiments, the system may apply further filters to the initial recommendation set to further remove, add, or modify recommendations, such as ordering the initial recommendation set to correspond to better matches being provided first. It is to be understood that there are various methods of applying this type of filter such as looping through the initial set of recommendations and removing those that do or do not correspond to certain types of filters. In yet further embodiments, the filters may modify display properties for recommendations, such as hiding recommendations that do not correspond to the user profile or adding an emphasis style to recommendations that are relevant to the user profile.

Once the system has chosen a set of filtered recommendations, the system continues to block 230. As discussed in more detail in relation to FIG. 3, the system may create one or more building scenarios for various subsets of recommendations. A building scenario is a virtual representation of the result of implementing one or more recommendations. Recommendations, or building related recommendations, as used herein, may include changes in building structure, content, characteristics, energy efficiency, or use. These recommendations may relate to the physical building, attached structures, grounds, or operation of a related system. For example, a recommendation may include the addition, modification, or removal of an appliance, insulation, or ventilation options; electrical, plumbing, heating, or other system, change of utility service or pricing plan; recycling possibilities; safety precautions; modification to user practices or social content; and other building and use suggestions. Recommended changes may be calculated as physical attributes that can be used in physics formulas. These physical attribute changes for a given recommendation set are referred to herein as condition parameters.

The physics-based building models discussed above can receive condition parameters and then predict a building scenario as a virtual representation of the building under these condition parameter physical attributes. The building scenario may include, for example: an updated list of the information about the physical properties of the building from the building profile; specific updated values relevant to the filter recommendations for this building scenario; other projected building properties not previously included in the building profile, such as implementation cost, energy savings, and environmental impact; and specifics of implementing filter recommendations for this building scenario, such as difference values compared to the un-modified building, instructions, recommendation component providers, and advertisements. A building scenario may be a snapshot view of the building, or may include various values for different time increments that the building model is configured to predict, i.e. hourly, daily, weekly, monthly, yearly, seasonally, or other increments.

The system then continues to block 235 where it selects probable recommendations. A probable recommendation is one the system determines will be helpful, followed, or found valuable to the user. The system may compare information from the received behavioral inputs in the user's profile to assign a confidence level or probability to filtered recommendations. These confidence levels may be used to add or remove recommendations from the set of recommendations that are displayed to the user, or they may be used to modify a display feature of recommendations.

At block 240 the system generates output elements. Output elements comprise data from the filtered recommendations, building scenarios, or probable recommendations. The output elements may comprise a single piece of data or data from a single recommendation or scenario, such a line of text "Gas Furnace" or may include data from a combination of recommendations or scenarios such as an advertisement for an electric heating system, pricing information for a local utility provider, and a monthly and yearly breakdown of savings from the building scenario that would result if the user installed the recommended heating system and switched to the recommended utility provider. Output elements may also be data structures designed to control an output device to react in a particular way. For example, the output element may provide a virtual walkthrough of the calculated ideal building scenario which also shows annotations at various points where recommendations were implemented as a user explores the virtual walkthrough. Such output elements may be combined with other content either by the system or by a third party to form a complete display, such as a website, for a user. This may include retrieving additional data associated with a recommendation such as third-party links, data from a different table in the database, or by communicating with another server or database to transform the recommendations and building scenarios into a format for display to the user. Additional content may be added to the output elements, for example by selecting static content or by performing an analysis of an output element to select additional relevant content or styles.

At block 245 the system displays the output elements. This may be accomplished by a server sending the output elements to a client device for display or by displaying the elements on a local device.

Figure 3:
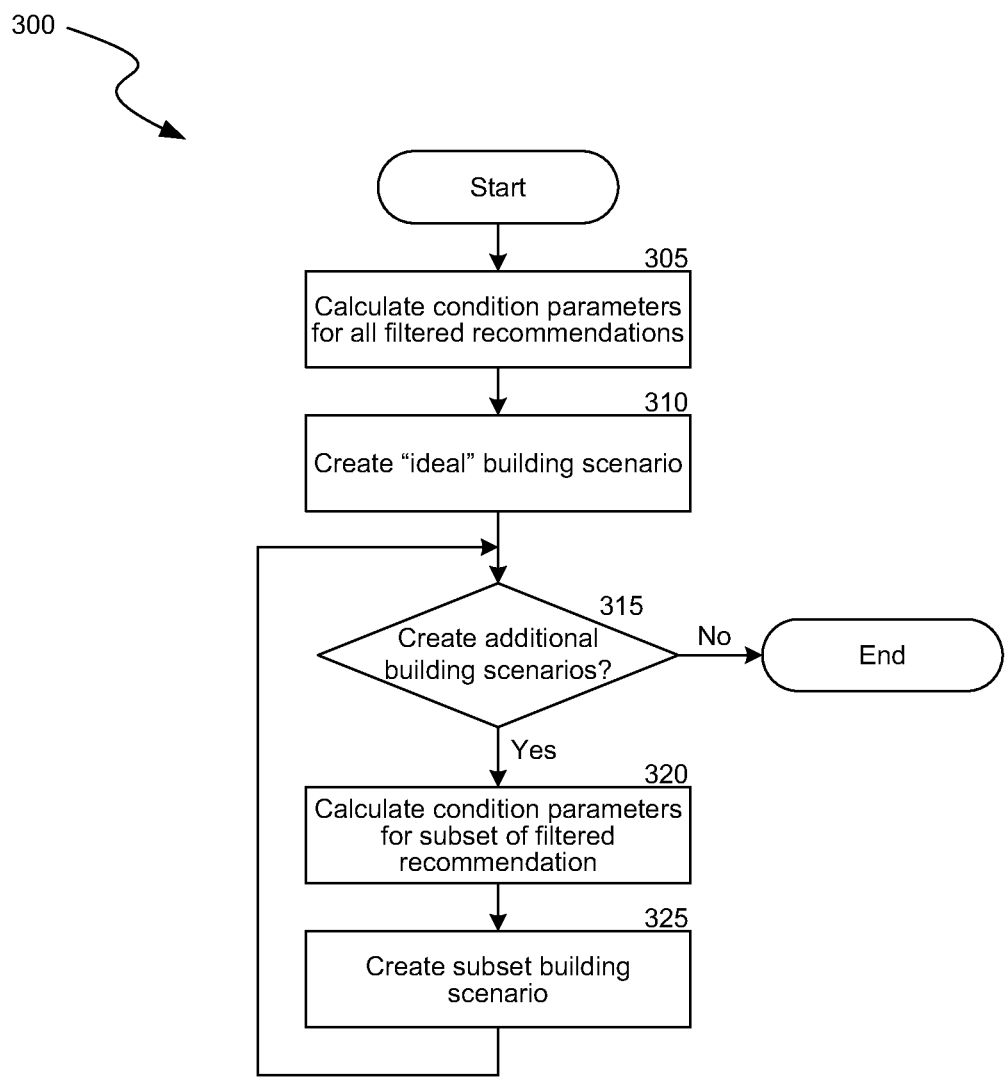
FIG. 3 is a flow diagram illustrating at least one embodiment of a routine to create building scenarios for a modeled building.

FIG. 3 is a flow diagram 300 illustrating at least one embodiment of a routine to create building scenarios for a modeled building. As discussed above in relation to elements 220-230 of FIG. 2, the system may select recommendations, referred to herein as filtered recommendations, which correspond to the building profile. The system may create various subsets of these filtered recommendations and build a building scenario for each subset. As also discussed above, a building scenario is a virtual representation of the result of implementing one or more recommendations. A building scenario may be created by applying condition parameters to a building model. In some embodiments the building model with the conditions parameters applied is a building scenario. In some embodiments output from "running" the building model over the condition parameters is, or may be used to create, a building scenario. The system may also create a base case building scenario, which is the building scenario with no implemented recommendations.

In some embodiments, a building scenario may include a difference between the information about the physical properties of the building and corresponding physical properties calculated by running the model of the building with condition parameters. In some embodiments the building scenario may include a difference between a base case building scenario and the building model run with condition parameters. In some embodiments the building scenario may include estimates of energy savings, estimates of cost savings, or simple payback for implementing the corresponding recommendation set.

The system starts at block 305 where it has received the set of filtered recommendations and calculates a set of condition parameters that can be used with the physics formulas of the building model. Each condition parameter may be based on a single filter recommendation, or may be based on a process of determining a physical property based on a combination of multiple recommendations.

At block 310 the determined set of condition parameters for all the filter parameters are applied to the building model to create an "ideal home" building scenario. The ideal home may be useful for creating a benchmark of energy use for a building, effectively measuring how much more efficient the building can become by showing the effect of implementing all the filtered recommendations. In some embodiments, the ideal home scenario shares all the characteristics of the user's home (size, vintage, number of appliances, etc.), and applies condition parameters for the best possible upgrades for insulation, windows, lighting, HVAC systems, thermostat, and a variety of appliances. In some embodiments, the system skips blocks 305 and 310 and only creates building scenarios for proper subsets of the filter recommendations.

At block 315 the system determines whether additional building scenarios should be created. In some embodiments the system creates at least one building scenario for each filtered recommendation. In some embodiments, the system may group recommendations into various categories, and create a building scenario for each category. For example, the system may create a category of recommendations related to a particular product or service provider; the resulting building scenario for this category of recommendations may show the benefits of implementing a bundle of recommendations. For instance, the system could create a category of recommendations for electric heating. In this instance, the system may select recommendations for an electricity provider, an electric heater, and an insulation system. The resulting building scenario would show the benefit of implementing all of these recommendations, even though the benefit of any one of these recommendations may not be significant enough to display to the user. If there are additional building scenarios, control passes to block 320, otherwise the process ends.

At block 320 the system selects the next subset of filter recommendations determined in block 315, and calculates a set of condition parameters corresponding to the selected subset of filter recommendations. As discussed above, the subset of filter recommendations may be a single recommendation or a group of recommendations.

At block 325 the system uses the condition parameters determined at block 320 to create a building scenario corresponding to the physical conditions accorded by the selected subset of filtered recommendations. The system then returns to block 315.

Figures 4A, 4B:
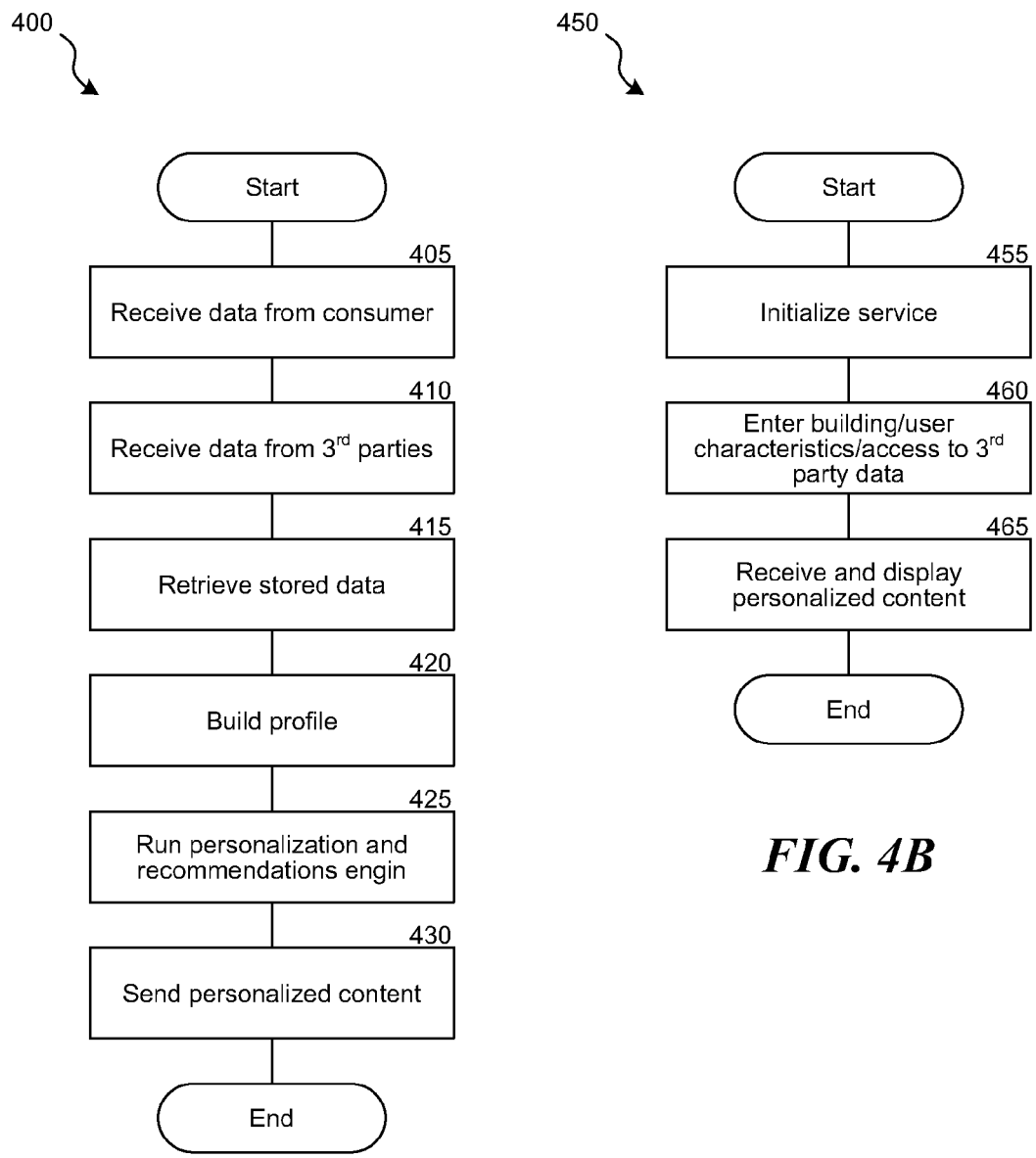
FIG. 4A is a flow diagram illustrating at least one embodiment of a routine performed by a server computing device to generate personalized building improvement content.
FIG. 4B is a flow diagram illustrating at least one embodiment of a routine performed by a client computing device to generate personalized building improvement content.

FIG. 4A is a flow diagram 400 illustrating at least one embodiment of a routine performed by a server computing device to generate personalized building improvement content. Beginning at step 405, the server receives data from a user. This data may contain physical parameters of a building and information about the user's goals and factors that motivate the user. For example, the system may present a set of forms to the user or request information from the client device. Examples of such information are a response question about the user's building, i.e., the size, insulation type, heating type, electrical appliances, and billing or usage history of the user. The system may also request the user grant it access to indirect information about the user's building and motivators. Examples of this kind of information are the user's browsing or search history, social media posts, regional information, and banking information.

The server then continues to block 410 where it receives data from third parties. This data may be publicly available such as weather conditions, regional home values, or energy consumption profiles. This data may also be private data that the user has authorized to release to the server such as the user's billing history, search history, social media posts or consumption, purchase history, home audit reports, peer comparisons, metering data, professional practices, or social connections.

At block 415 the server retrieves stored data relevant for the current user. This data may include data previously received for this user or information related to the user's activities on the server such as browsing history, purchases, indications of the type of equipment the user is connecting from, connection data, frequency of visits, or previous recommendations given to this user.

Any of the data received in blocks 405-415 may include default values. The device implementing this process may require certain data to build the user's profile or the party sending the information may have a default value that is sent when individualized data is not available. These default values may be truly general for all users where their personal value is not available, or they may be estimates based on other data known about the user, such as region, nationality, details of their request such as their IP address, age, economic status, other building features, or a particular time frame determined for the user or the request.

At block 420 the server creates a user profile. The user profile may comprise a building profile and a behavioral model. The building profile may contain information about the physical properties of the building and a physics-based model of the building such as predictive functions or function parameters. The server may build the user profile by separating the data received at blocks 405-415 into data about the user's building and data about the user. Some of the data received in blocks 405-415 may fall into both categories. The data about the user's building is then analyzed to discern particular physical characteristics about the user's building. As discussed above in relation to FIG. 2, the building profile may also contain a building model with functions that show how the building will respond under various conditions. The building model may be physics-based in that the generated functions apply physics formulas to determine how a condition will affect the operation of the building. In some embodiments the building model is created on a time scale, such as hourly, daily, or monthly. The behavioral model may contain information such as user characteristics, history of user actions, predicted user actions, or probability functions for user actions.

As also discussed above in relation to FIG. 2, the system at block 425 may then run an RPE on the user profile to create personalized output elements for the user. This process may comprise selecting filtered recommendations, applying the building model to one or more subsets of the filtered recommendations to create building scenarios, and applying the behavior model to one or more subsets of the filtered recommendations to determine probable recommendations.

The server, at block 430, sends the output elements to the client device. The output elements may be encapsulated in a website, pre-processed for incorporation in a mobile app., converted into encoded formats such as XML, embedded in other content such as a virtual environment, flash presentation, or incorporated in video content.

FIG. 4B is a flow diagram 450 illustrating at least one embodiment of a routine performed by a client computing device to generate personalized building improvement content. The client computing device may be any device that interfaces with a server to retrieve personalized building recommendation content. For example, the client computing device may be a personal computer running proprietary software or a webpage, a mobile device running an app or connecting to a webpage, or a smart-TV app.

Beginning at block 455, the client initializes the personalization service. This may entail accessing a website, setting up a server connection, or connecting to a local or networked database.

At block 460 the client receives instructions from the server and prompts the user for information. In some embodiments, the client may prompt the user for direct information such as details about their building, energy usage, and billing history. In some embodiments, the client may prompt the user for information related to accessing information from sources other than the user. This information may comprise login information for the user's accounts such as a username and password to the user's utility billing service, social media providers, or building audit service. In some embodiments this information provides access to the user's home monitoring systems such as metering from a smart thermostat or plugs. This information may also contain authorization for the server to retrieve and use the information now accessible by the server.

At block 465 the system receives from the server personalized output elements based on the data sent to the server in block 465. The client then displays the personalized content to the user. In some embodiments, the client may first perform additional processing on the received data before displaying it to the user.

Figure 5:
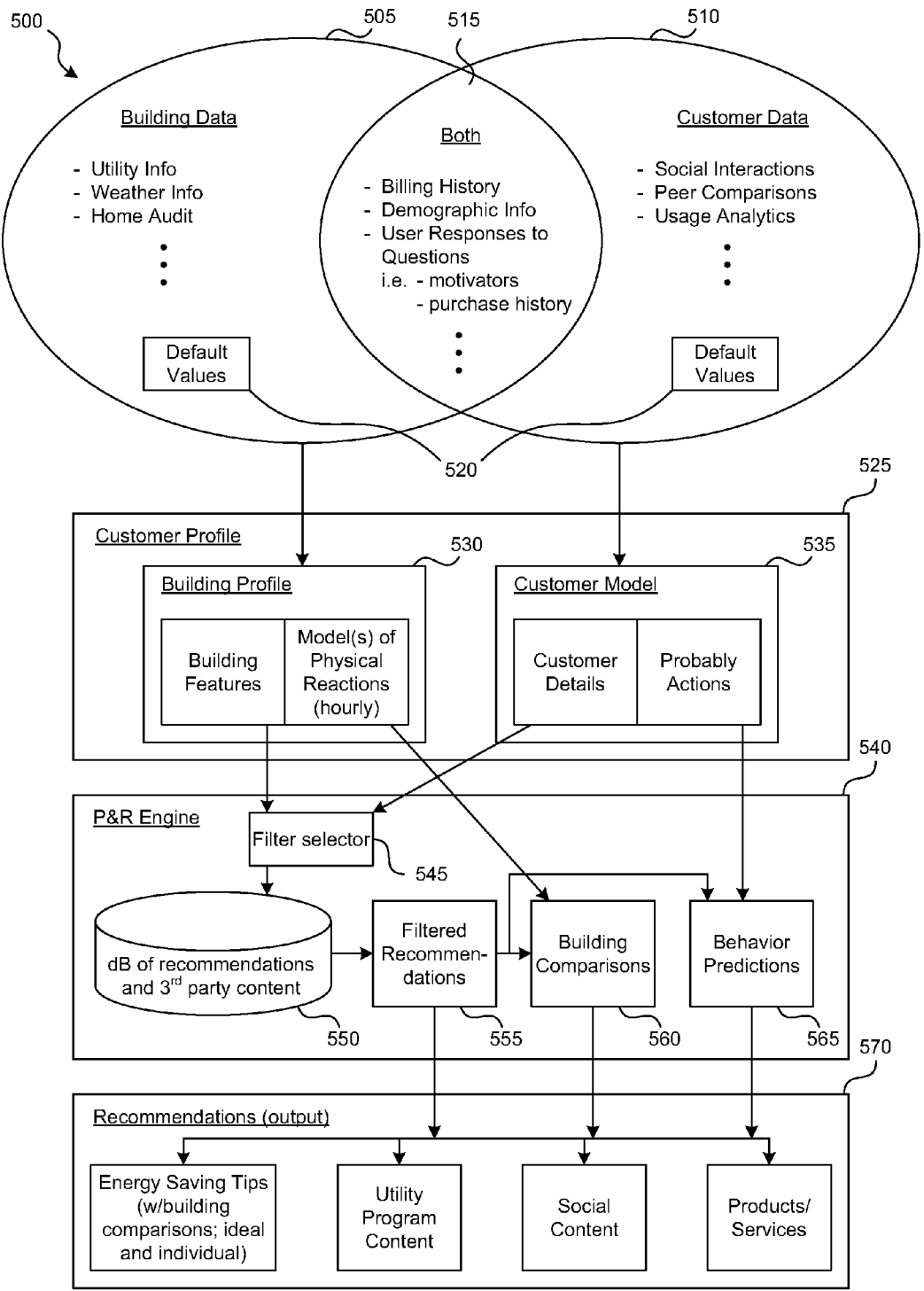
FIG. 5 is a block diagram illustrating components in some embodiments for generating personalized building improvement content.

FIG. 5 is a block diagram 500 illustrating components in some embodiments for generating personalized building improvement content. Blocks 505, 510, and 515 show a Venn diagram of data received by the system. This data may have been received from the user, from a third party, or may be locally available to the system.

Block 505 shows data relating to the user's building. In some embodiments this data may include neighborhood, similar homes, third party metadata, home audit reports, real-time energy use, sub-metering data, utility inputs, historical billing data, real-time/disaggregated plug level data, real-time/HAN data, building structure information (size, levels, construction, age, etc.), HVAC information (fuels, heating type, cooling type, etc), end use information (appliances, electronics, etc.), climate, usage patterns, the interaction of individual end-uses, gas, electric and water loads, or any other data that the system may use to identify features of the building. In some embodiments, where the user's building is equipped with a smart thermostat, this data may include the results of a series of controlled thermostat changes applied by the system. These results may indicate unique physical characteristics of the building envelope and performance of the HVAC system.

Block 510 shows data relating to the user. In some embodiments this data may include customer motivators, customer feedback, peer comparisons, usage analytics, social interactions, previous interactions with the system, goals, social interactions, customer ratings, committed and completed savings actions, or responses to questionnaires.

The data from blocks 505-515, as well as the similar data from blocks 205, and 405-415, instead of relating to a particular user/building may relate to one or more sample or default buildings or users. For example, the system may build a set of sample recommendations, using the physics based model, for 10 generic buildings data sets. When a user logs into the system they choose or provide information to select a building model. The system may then present the pre-selected set of recommendations for that building model.

Block 515 shows that the system may use some data to infer properties about both the user's building and about people who utilize the building.

Some of the information from blocks 505-515 may be defaults, as shown in block 520. Defaults may indirectly pertain to the user and their building through statistics such as regional or national averages or other values selected based on known user properties, or they may be universal defaults. For example, when information about equipment characteristics, numbers, and schedules are not available, assumptions may be made to model these loads based on regional averages. These averages may be derived from reports such as the 2005 EIA Residential Energy Consumption Survey (RECS) and Public Use Microdata Sample (PUMS). To account for hourly variation in usage, probability profiles for each lamp, appliance, and miscellaneous electrical load (MEL) may be modeled. In some embodiments where the building is AMI or HAN enabled, hourly energy usage may be used to estimate the size of large equipment such as HVAC fans, compressors, and heating elements.

Block 525 shows a user profile containing building profile 530 and behavioral model 535. As discussed above in relation to FIGS. 2 and 4A, the building profile 530 may comprise building properties discerned from data 505 and 515 and a building model. The behavioral model 535 may comprise customer details and probable actions discerned from data 510 and 515. In some embodiments, the system may not separately store the building features and building model nor separately store the customer details and probable actions. Instead, the system may store the relevant data and generate the building model and/or the behavioral model from stored data on the fly.

The system may create a building model by generating functions that show how the building will respond under various conditions. In some embodiments the building model consists of a set of parameters for generic functions. The building model may be physics-based in that the functions apply physics formulas to determine how a physical condition will affect the operation of the building. In some embodiments the building model is created on a time scale, such as hourly, daily, or monthly. A time scale building model can determine how a condition will affect the operation of a building during a time range of interest.

The behavioral model may contain information such as demographics, historical behavior measured through interactions with the system, historical consumption, committed and completed savings actions, and responses to questionnaires. With this information, the system finds correlations, for example a probabilistic model, between users to select a set of recommendations that are likely to benefit the user or that will be followed by the user.

In some implementations the system may select filters and/or recommendations based on the building model and not use a behavioral model. Alternatively, in some implementations, the system may select filters and/or recommendations based on the behavioral model and not use a building model.

Block 540 shows an RPE employed by the system. The RPE has a filter selector 545. In some embodiments, filter selector 545 receives building features from the building profile 530 and customer details from the behavioral model 535. This data is used to build a query for database 550 to select a set of recommendations pertinent to the user. For example, a database query may contain the following code to select all recommendations in a database:

SELECT * FROM recommendations

A first filter activated by a determination that the user has a gas furnace may modify this query to select recommendations for users with gas furnaces and recommendations that do not recommend the installation of a gas furnace:

SELECT * FROM recommendations
WHERE buildingHeating="gasFurnace" OR
recommendationFor !="gasFurnace"

In other embodiments filter selector 545 may be used to add recommendations, remove recommendations from an initial set of recommendations, or change the formatting of recommendations.

Block 555 shows the set of filtered recommendations that result from operating the selected filters on database 550.

Block 560 shows a building scenario generator. As discussed in relation to FIG. 3, the building scenario generator 560 receives data or functions from the building profile 530 and creates building scenarios, which are virtual representations of the result of implementing one or more of the filtered recommendations 555. The system may accomplish this by applying functions of a physics-based building model. In some embodiments an "ideal building" scenario is created by projecting the implementation of all the filtered recommendations 555.

Block 565 shows a behavior predictor. As discussed in relation to FIGS. 2 and 4A, the behavior predictor selects probable recommendations by determining which of the filtered recommendations 555 will be helpful, followed, or found valuable by the user. The system may compare information from the behavioral model 535 to assign a confidence level or probability to filtered recommendations 555. Recommendations with a high confidence level or probability may be selected as probable recommendations.

Block 570 shows a component that selects or formats output elements from the filtered recommendations 555, building scenarios from block 560, and probable recommendations from block 565. These output elements may comprise energy saving tips, building scenario comparisons, utility program content, social content, products, and services.

From the foregoing, it will be appreciated that specific embodiments of the invention have been described herein for purposes of illustration, but that various modifications may be made without deviating from the scope of the invention. Accordingly, the invention is not limited except as by the appended claims.

We claim:

1. A method, performed by a computing system, of providing personalized building related recommendations, the method comprising:
    receiving, by the computing system, a first set of data elements representing features of a building;
    receiving, by the computing system, a second set of data elements representing user characteristics of a user;
    creating, by the computing system and using the first set of data elements, a building model;
    creating, by the computing system and using the second set of data elements, a behavioral model that comprises a probabilistic model wherein the probabilistic model is based on correlations identified between the user and one or more other users;
    choosing, by the computing system, potential recommendations;
    creating, by the computing system, one or more building scenarios,
        wherein each particular building scenario, of the one or more building scenarios, is created by:
            operating the building model under condition parameters that would be in place for the building when a selected set of the potential recommendations, corresponding to the particular building scenario, is implemented, and
            computing an amount of cost or energy consumption by the building when implementing the selected set of the potential recommendations corresponding to the particular building scenario;
    using, by the computing system, the behavioral model to assign a user confidence level to each selected potential recommendation, of one or more of the potential recommendations, wherein each user confidence level indicates an expected level to which the corresponding potential recommendation will be helpful, followed, or found valuable to the user;

selecting, by the computing system, one or more elements from the potential recommendations, wherein each selected element of the one or more elements is selected based on (A) the amount of cost or energy consumption associated with the building scenarios that the selected element was used in creating and (B) the user confidence level assigned to the selected element; and creating and transmitting, by the computing system, the personalized building related recommendations, wherein the personalized building related recommendations include at least one of the selected one or more elements.

2. The method of claim 1 wherein the building model is a set of data elements configured to be used with a set of default functions to represent how the building will act under various condition parameters.

3. The method of claim 1 wherein the building model is a physics-based model that is configured to determine how a physical condition will affect the operation of the building by applying one or more physics formulas.

4. The method of claim 1 wherein the potential recommendations are chosen from recommendations in a database.

5. The method of claim 4 wherein choosing the potential recommendations comprises creating a database query based on a set of recommendation filters.

6. The method of claim 1 wherein each of the personalized building related recommendations includes one of: an energy saving tip, utility program content, social content, an identification of a product, or an identification of a service.

7. The method of claim 1 wherein the correlations identified between the user and one or more other users for the behavioral model are determined based on one or more of: user demographics, historical user behaviors, responses to questionnaires, or any combination thereof.

8. The method of claim 1 wherein creating and transmitting the personalized building related recommendations comprises formatting one or more of the selected one or more elements based on selected recommendation filters.

9. The method of claim 8 wherein formatting the one or more of the selected one or more elements comprises sorting or reordering the selected one or more elements based on the features of the building or user characteristics of the user.

10. The method of claim 1 wherein selecting the one or more elements from the potential recommendations based on the user confidence level assigned to each selected element is performed by using the user confidence levels to modify a display property of elements included in the personalized building related recommendations.

11. The method of claim 1 wherein each of the one or more building scenarios corresponds to one or more of: an estimate of energy savings, an estimate of cost savings, or any combination thereof.

12. The method of claim 1 wherein the first set of data elements or the second set of data elements comprises default values based on regional or national averages.

13. A system for providing personalized building recommendations, the system comprising:
one or more processors;
a memory coupled to the one or more processors;
a profile builder configured to:
receive a first set of data elements representing features of a building;
receive a second set of data elements representing user characteristics of a user;
create, using the first set of data elements, a building model; and
create, using the second set of data elements, a behavioral model that comprises a probabilistic model wherein the probabilistic model is based on correlations identified between the user and one or more other users;
a recommendation personalization engine configured to:
choose potential recommendations;
creates one or more building scenarios, wherein each particular building scenario, of the one or more building scenarios, is created by:
operating the building model under condition parameters that would be in place for the building when a selected set of the potential recommendations, corresponding to the particular building scenario, is implemented, and
computing an amount of cost or energy consumption by the building when implementing the selected set of the potential recommendations corresponding to the particular building scenario; and
use the behavioral model to assign a user confidence level to each selected potential recommendation, of one or more of the potential recommendations, wherein each user confidence level indicates an expected level to which the corresponding potential recommendation will be helpful, followed, or found valuable to the user; and
an output generator configured to:
select one or more elements from the potential recommendations, wherein each selected element of the one or more elements is selected based on (A) the amount of cost or energy consumption associated with the building scenarios that the selected element was used in creating and (B) the user confidence level assigned to the selected element; and
create and transmit the personalized building related recommendations, wherein the personalized building related recommendations include at least one of the selected one or more elements.

14. The system of claim 13 wherein the building model is a physics based model that is configured to determine how a physical condition will affect the operation of the building by applying one or more physics formulas.

15. The system of claim 13 wherein the recommendation personalization engine is configured to choose the potential recommendations by executing a query against a database of recommendations, wherein the query is constructed using at least some of the first set of data elements and at least some of the second set of data elements.

16. The system of claim 13 wherein at least one of the created one or more building scenarios is an ideal building scenario such that the set of the potential recommendations corresponding to the ideal building scenario includes all the chosen potential recommendations.

17. A non-transitory computer-readable storage medium storing instructions that, when executed by a computing system, cause the computing system to perform operations for providing personalized building recommendations, the operations comprising:
receiving a first set of data elements representing features of a building;
receiving a second set of data elements representing user characteristics of a user;

creating, using the first set of data elements, a building model;

creating, using the second set of data elements, a behavioral model that comprises a probabilistic model wherein the probabilistic model is based on correlations identified between the user and one or more other users;

choosing potential recommendations;

creating one or more building scenarios, wherein each particular building scenario, of the one or more building scenarios, is created by:

operating the building model under condition parameters that would be in place for the building when a selected set of the potential recommendations, corresponding to the particular building scenario, are implemented, and computing an amount of cost or energy consumption by the building when implementing the selected set of the potential recommendations corresponding to the particular building scenario;

using the behavioral model to assign a user confidence level to each selected potential recommendation, of one or more of the potential recommendations, wherein each user confidence level indicates an expected level to which the corresponding potential recommendation will be helpful, followed, or found valuable to the user;

selecting one or more elements from the potential recommendations, wherein each selected element of the one or more elements is selected based on (A) the amount of cost or energy consumption associated with the building scenarios that the selected element was used in creating and (B) the user confidence level assigned to the selected element; and creating and transmitting the personalized building related recommendations, wherein the personalized building related recommendations include at least one of the selected one or more elements.

18. The non-transitory computer-readable storage medium of claim 17 wherein the building model includes a set of data elements configured to be used with a set of default functions to represent how the building will act under various condition parameters.

19. The non-transitory computer-readable storage medium of claim 17 wherein each of the one or more building scenarios corresponds to one or more of: an estimate of energy savings, an estimate of cost savings, or any combination thereof.

20. The non-transitory computer-readable storage medium of claim 17 wherein the first set of data elements or the second set of data elements comprises default values based on regional or national averages.

\* \* \* \* \*